United States Patent [19]

Shirato

[11] Patent Number: 5,012,311
[45] Date of Patent: Apr. 30, 1991

[54] SEMICONDUCTOR THIN FILM DEVICE WITH THICK INSULATOR AT GATE EDGE

[75] Inventor: Takehide Shirato, Hiratsuka, Japan

[73] Assignee: Fujitsu Limited, Kawasaki, Japan

[21] Appl. No.: 418,965

[22] Filed: Oct. 10, 1989

Related U.S. Application Data

[63] Continuation of Ser. No. 11,814, Feb. 6, 1987, abandoned.

[30] Foreign Application Priority Data

Feb. 7, 1986 [JP] Japan .............................. 61-025022

[51] Int. Cl.⁵ ..................... H01L 29/78; H01L 27/12
[52] U.S. Cl. ...................................... 357/23.7; 357/4; 357/56
[58] Field of Search ............................ 357/23.7, 4, 56

[56] References Cited

U.S. PATENT DOCUMENTS

| | | | |
|---|---|---|---|
| 4,242,156 | 12/1980 | Peel | 357/23.7 |
| 4,251,828 | 2/1981 | Sakurai | 357/23.7 |
| 4,277,884 | 7/1981 | Hsu | 357/23.7 |

FOREIGN PATENT DOCUMENTS

58-184759 10/1983 Japan ................................. 357/23.7

Primary Examiner—Jerome Jackson, Jr.
Attorney, Agent, or Firm—Armstrong, Nikaido, Marmelstein, Kubovcik, & Murray

[57] ABSTRACT

A semiconductor device comprises an insulating substrate; an island shaped single-crystalline semiconductor layer on the insulating substrate; and a conductor pattern provided on the single-crystalline semiconductor layer through the insulating layer and extending onto the insulating substrate. The edge region of the single-crystalline semiconductor layer, which region is below the conductor pattern, in the insulating layer is selectively formed with a larger thickness than other portions of the insulating layer.

5 Claims, 7 Drawing Sheets

SEMICONDUCTOR THIN FILM DEVICE WITH THICK INSULATOR AT GATE EDGE

This application is a continuation of application Ser. No. 011,814, filed Feb. 6, 1987, now abandoned.

BACKGROUND OF THE INVENTION

1. Field of the Invention

The present invention relates to a semiconductor device having an SOI structure, i.e., Silicon On Insulator, and a method for producing the same. More particularly, it relates to a structure for improving the gate break down voltage in a MIS semiconductor device having an SOI structure and the method for producing the same.

2. Description of the Related Art

Recently, a semiconductor device having an SOI structure produced by the steps of forming a polycrystalline silicon layer on an insulating layer formed on a semiconductor substrate, single-crystallizing the polycrystalline silicon layer by a laser annealing process, etc., and forming a MIS transistor on the obtained single-crystallized semiconductor layer (Silicon on Insulator) was proposed, to obtain a high density and high break down voltage. In the MIS transistor having an SOI structure, insulation between a gate electrode and an SOI substrate is carried out merely by forming a thin gate insulating layer, and thus a gate breakdown voltage is likely to be lowered by partial defects in the gate insulating layer formed below the gate, so that the gate breakdown voltage is reduced.

SUMMARY OF THE INVENTION

Therefore, the object of the present invention is to provide a semiconductor device having an SOI structure, wherein a high breakdown voltage can be obtained.

Another object of the present invention is to provide a semiconductor device having an SOI structure, wherein a high voltage drive MOS transistor can be easily formed.

A still further object of the present invention is to provide methods for producing the above-mentioned semiconductor device having an SOI structure.

According to the present invention there is provided a semiconductor device comprising an insulating substrate; an island shaped single crystalline semiconductor layer on the insulating substrate; and a conductor pattern provided on the single crystalline semiconductor layer through the insulating layer and extending onto the insulating substrate. The edge region of the single crystalline semiconductor layer, which region is below the conductor pattern, in the insulating layer, is selectively formed in a larger thickness than other portions of the insulating layer.

According to the present invention there is further provided a method for producing a semiconductor device comprising the steps of: forming an island-shaped single crystalline semiconductor layer on an insulating layer; forming an anti-oxidation layer on the single crystalline semiconductor layer and forming an opening selectively exposing a part of the single crystalline semiconductor layer; selectively forming a first oxide layer at a part of the edge portion of the semiconductor layer by selective oxidation using the anti-oxidation layer as a mask; after removing the anti-oxidation layer, forming a second oxide layer on the semiconductor substrate by a thermal oxidation process; and forming a conductor pattern on the semiconductor layer so that the pattern selectively passes through a part of the edge portion and extends onto the insulating substrate.

BRIEF DESCRIPTION OF THE DRAWINGS

The feature of the present invention will become clearer from the ensuring description of preferred embodiments made in reference to the accompanying figures, in which.

DESCRIPTION OF THE PREFERRED EMBODIMENTS

Before describing the present invention the related art will be explained in detail.

FIGS. 1A to 1D are process plan main views explaining a conventional production method of a MIS transistor having an SOI structure, and FIGS. 2A to 2D are process cross-sectional views taken along line A—A.

Figure 1A:
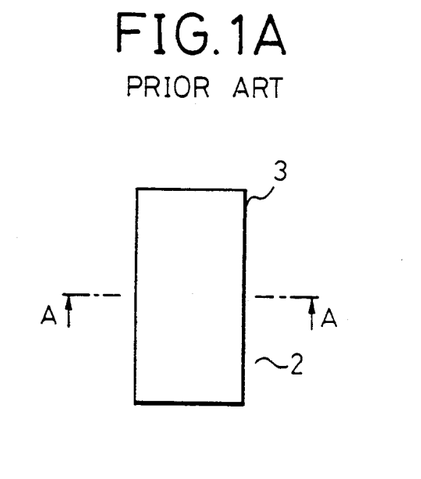
FIGS. 1A to 1D are process plan main views explaining a conventional production method of a MIS transistor having an SOI structure.
Figure 2A:
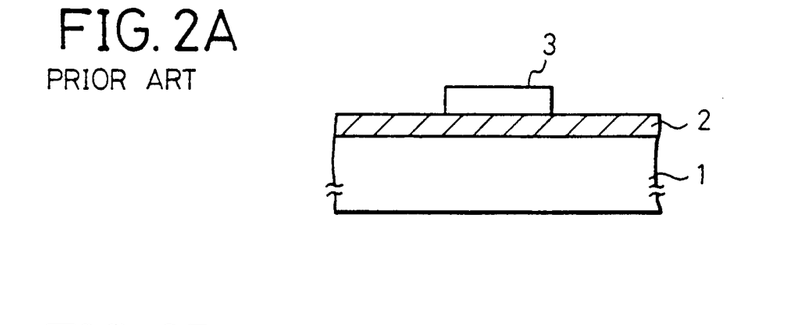
FIGS. 2A to 2D are process cross-sectional views taken along line A—A.

As shown in FIGS. 1A and 2A, an insulating layer 2 is formed on a semiconductor substrate 1, a polycrystalline silicon layer is formed on the insulating layer 2 and single-crystallized by a laser annealling process, etc., to form a single-crystalline silicon layer. The single-crystalline silicon layer is then patterned silicon layer, and, for example, an n-type single-crystalline silicon layer 3 having an island shape, is formed on the insulating layer 2 by selectively introducing desired impurities thereinto.

Figure 1B:
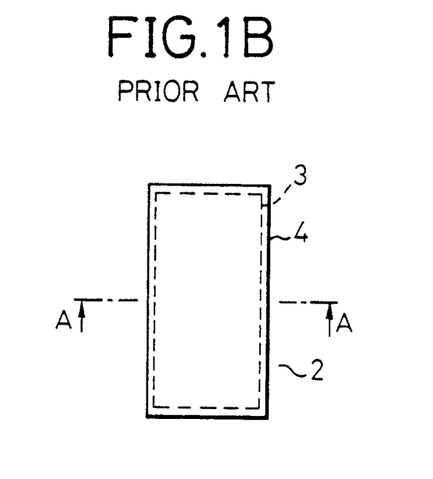
Figure 2B:
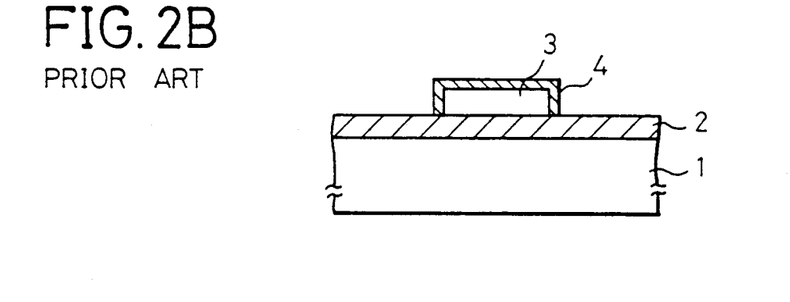

Then, as shown in FIGS. 1B and 2B, on a surface of the single-crystalline silicon layer 3 a gate oxide layer 4 having a thickness of about 1000 Å, by which a desired threshold voltage can be obtained, is formed on the surface of the single-crystalline silicon layer 3.

Figure 1C:
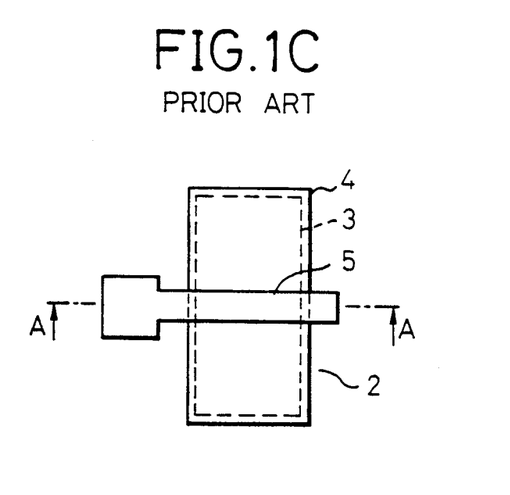
Figure 2C:
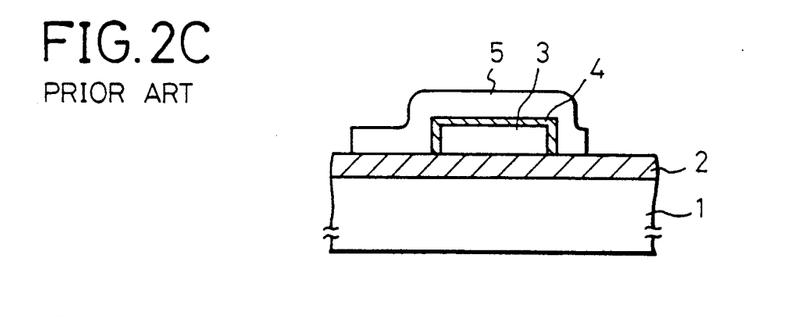

Then, as shown in FIGS. 1C and 2C, a polycrystalline silicon layer 5 is formed on the entire surface of the semiconductor substrate 1, and desired impurities are introduced into the polycrystalline silicon to provide conductivity thereto. Then after patterning the polycrystalline silicon layer, a polycrystalline silicon gate electrode lying on both the single-crystalline silicon layer 3 and the insulating layer 2 is formed.

Figure 1D:
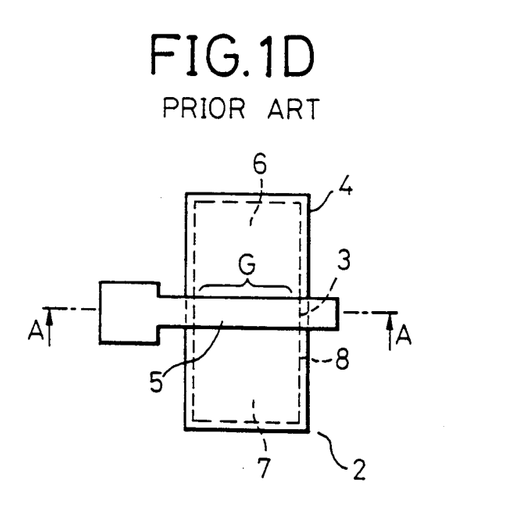
Figure 2D:
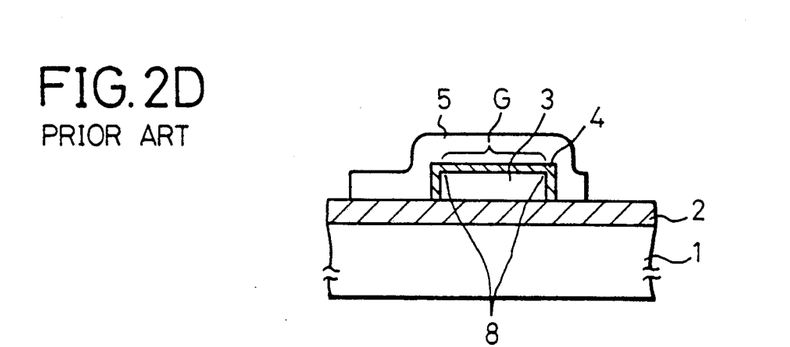

Then, as shown in FIGS. 1D and 2D, using the gate electrode 5 as a mask, impurity ions are selectively implanted into the single-crystalline silicon layer 3 to form a p-type source region 6 and drain region 7.

Thus, a conventional semiconductor device having an SOI structure is obtained.

In such a conventional semiconductor device having an SOI structure, insulation between a region, except for a region G acting as a gate controlled by the gate electrode 5, and the single-crystalline silicon layer has been maintained by the gate oxide layer 4 having the same thickness as that of the gate acting region G.

However, in such a conventional structure, the gate oxide layer 4 formed by a thermal oxidation process sometimes generates defects at the edge portion of the single-crystalline silicon layer 3, whereby the gate breakdown voltage to the single-crystalline silicon layer 3 is lowered due to the defects of the edge portion 8 thereof, making it difficult to form a high voltage drive element.

FIGS. 3A to 3D are process cross-sectional views of another convential art as disclosed in Japanese Unexamined Patent Publication (Kokai) No. 58-184759, published Oct. 28, 1983.

The publication (−759) discloses a method for producing a semiconductor having an SOS (Silicon On Sapphire) structure to improve the breakdown voltage.

Figure 3A:
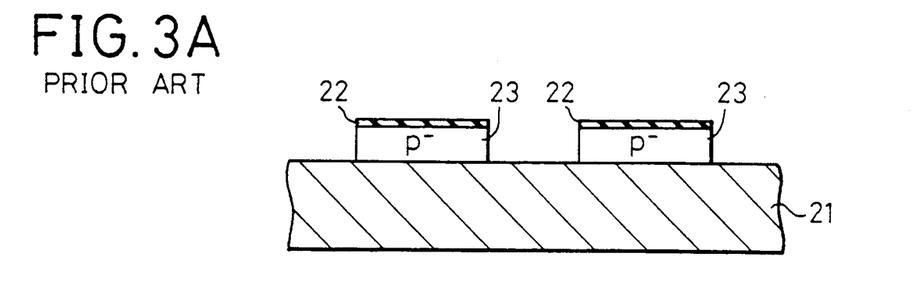
FIGS. 3A to 3D are process cross-sectional views of another convential art.

In the conventional art, as shown in FIG. 3A, a p⁻-type single-crystalline silicon layer is formed on an insulating layer such as a sapphire substrate 21.

Then a silicon nitride layer is formed on the silicon layer. Subsequently, the silicon nitride layer and the silicon layer are patterned to form an island-shaped silicon layer 23 with the silicon nitride region 22.

Figure 3B:
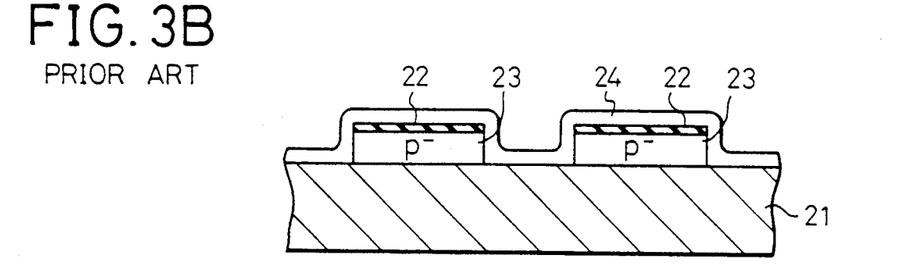
Figure 3C:
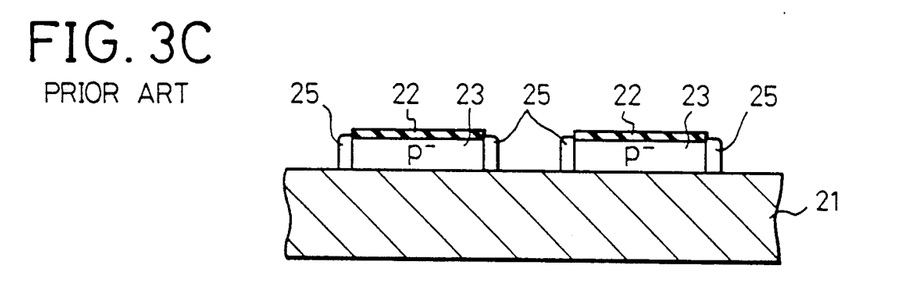

Then as shown in FIG. 3B a thin undoped polycrystalline silicon layer 24 is formed, on the entire surface of the obtained structure. Then, RIE etching is carried out in a direction vertical to the surface of the polycrystalline silicon layer 24 so that a structure having remaining polycrystalline silicon 25 on the sides, as shown in FIG. 3C, is obtained. After heat treatment of the obtained structure in oxygen, a thick oxide layer 26 can be obtained.

Subsequently, a semiconductor having an SOS structure is produced by a well known method.

Figure 3D:
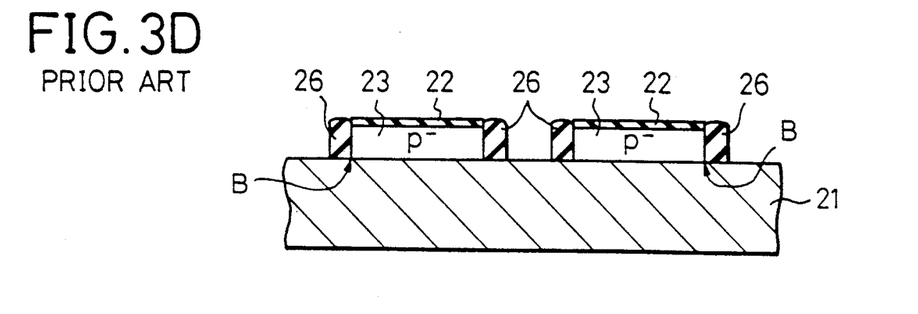

A thick oxide layer 26 shown in FIG. 3D acts as a layer used to improve the breakdown voltage. However, between the lower portion of the thick layer and the silicon layer i.e. B point shown in FIG. 3D gap and defects are formed.

FIGS. 4A to 4F are process plan views of an example of a production method of a p channel MOS transistor having an SOI structure according to the present invention; and FIGS. 5A to 5F are process cross-sectional views taken along line A—A.

Figure 4A:
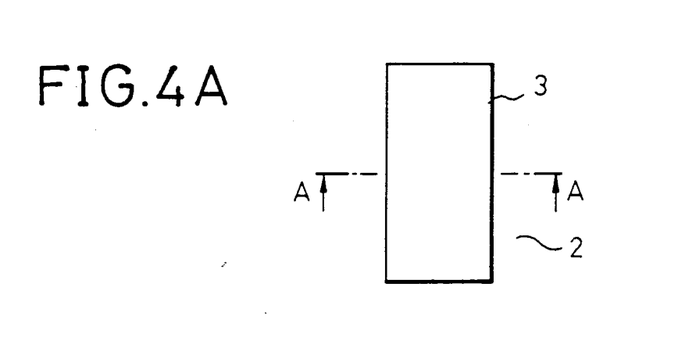
FIGS. 4A to 4F are process plan views of an example of a production method according to the present invention.
Figure 5A:
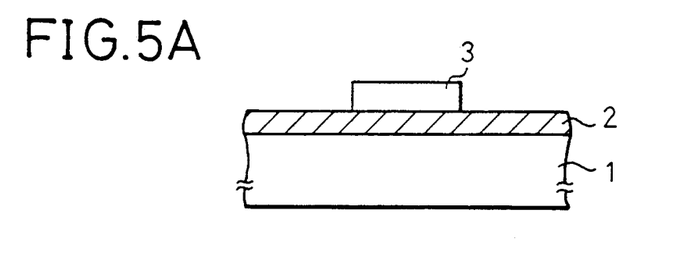
FIGS. 5A to 5F are process cross-sectional views taken along line A—A.

As shown in FIGS. 4A and 5A, a silicon dioxide (SiO₂) insulating layer 2 having a thickness of about 1 μm is formed, by a thermal oxidation process at a temperature of 1000° C., on a silicon substrate 1 having a predetermined conductivity type, for example p-type.

Then, a non-doped polycrystalline silicon layer having a thickness of 0.5 to 1.0 μm is formed, on the SiO₂ insulating layer 2. Subsequently, the polycrystalline silicon layer is single-crystallized by a laser annealing process and the single-crystallized silicon layer is patterned by usual photolithography technique, so that an island-shaped single-crystallized layer 3 is formed on the SiO₂ insulating layer 2. Then, impurity ions, for example, $10^{11}$ to $10^{12}$ dose/cm² phosphorus ions, are selectively implanted into the single-crystallized silicon layer 3 so that an n⁻-type single-crystallized silicon layer 3 can be formed by a desired annealing treatment.

Figure 4B:
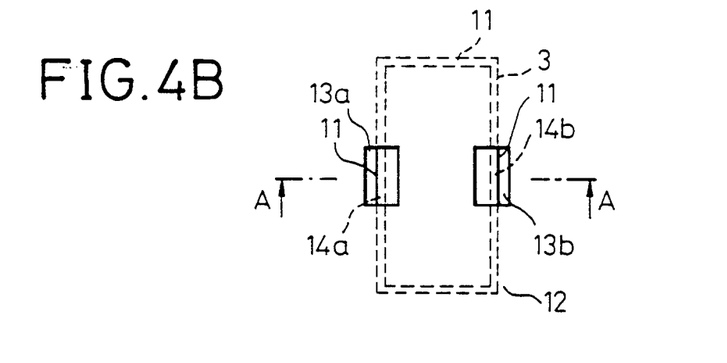
Figure 5B:
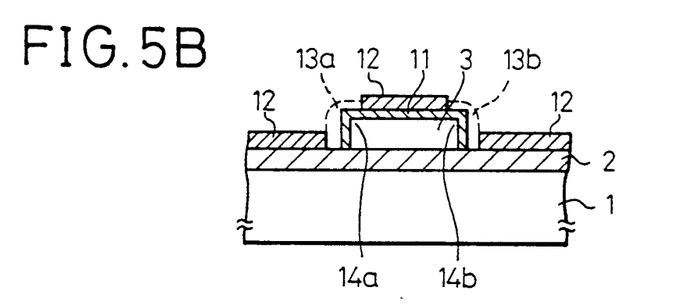

Then, as shown in FIGS. 4B and 5B, an thermal oxidation layer 11, having a thickness of about 500 Å, and used as a buffer layer, is formed on the surface of the single-crystallized silicon layer 3. Then, silicon nitride (Si₁₃N₄) layer 12, having a thickness of about 1000 Å, is formed on the surface of the silicon layer 3 and the SiO₂ insulating layer 2. Subsequently, openings 13a and 13b, which expose the thermal oxidation layer positioned on edge portions 14a and 14b of the single-crystallized silicon layer 3 and the SiO₂ layer 2, are formed in the Si₃N₄ layer 12 by a usual photolithography technique. The edge portions 14a and 14b are crossed by a gate electrode formed on the silicon layer 3.

Figure 4C:
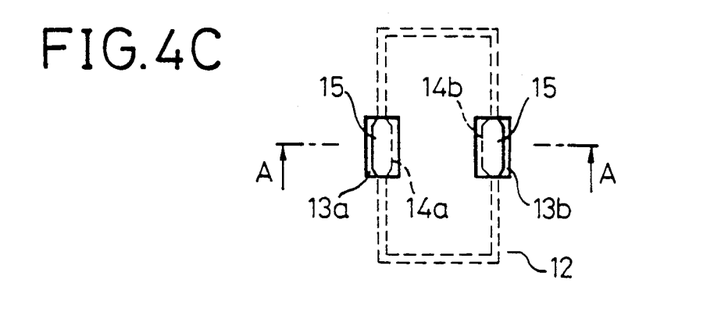
Figure 5C:
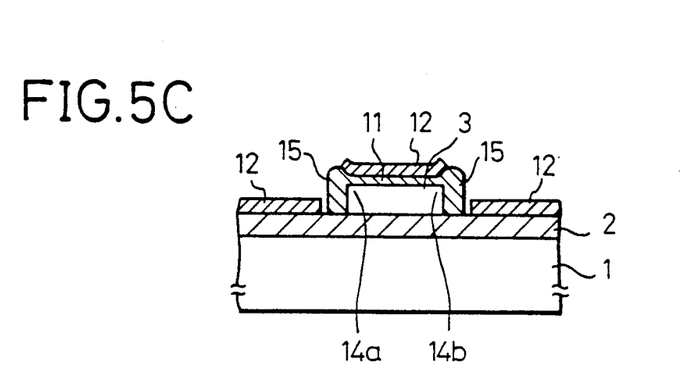

Then, as shown in FIGS. 4C and 5C, using an Si₃N₄ layer 12, a thermal oxidation treatment at a temperature of about 900° C. is carried out so that a first thermal oxidation layer 15 having a thickness of about 5000 Å is formed above the edge portions 14a and 14b of the silicon layer 3, i.e., in the openings 13a and 13b.

Figure 4D:
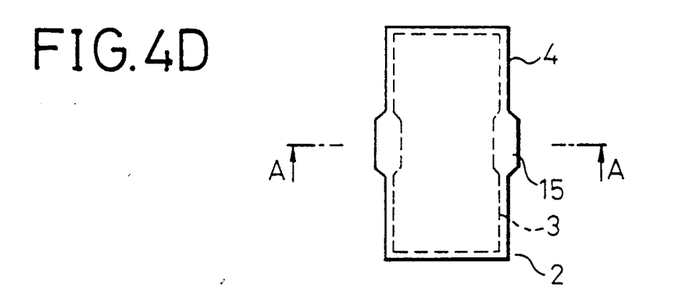
Figure 5D:
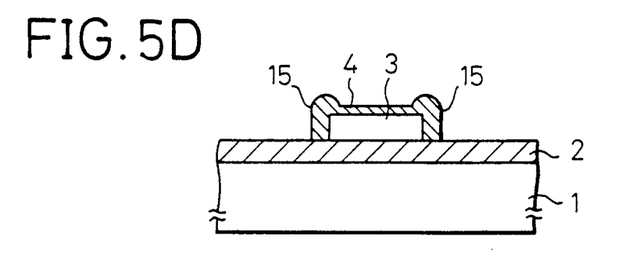

Then, as shown in FIGS. 4D and 5D, Si₃N₄ layer 12 is removed by a phosphoric acid boiling process, etc., and then the SiO₂ layer 11 acting as a buffer layer, and formed below the Si₃N₄ layer 12, is removed by a hydrofluoric acid-containing liquid, with the result that the silicon layer 3 is exposed. Subsequently, a second thermal oxidation treatment process is carried so that a gate oxide layer 4 which is a second thermal oxidation layer having a thickness of, for example, 1000 Å, and having a predetermined threshold voltage is formed on the silicon layer 3.

When the SiO₂ layer 11 is removed, the thickness of the first thermal oxidation layer 15 is reduced by about 500 Å. However, when the gate oxide layer 4 is formed, the thickness thereof is added to the reduced thickness, and thus the thickness thereof becomes about 5000 Å.

Figure 4E:
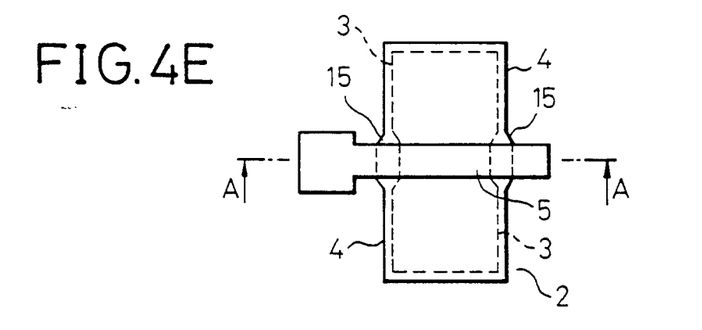
Figure 5E:
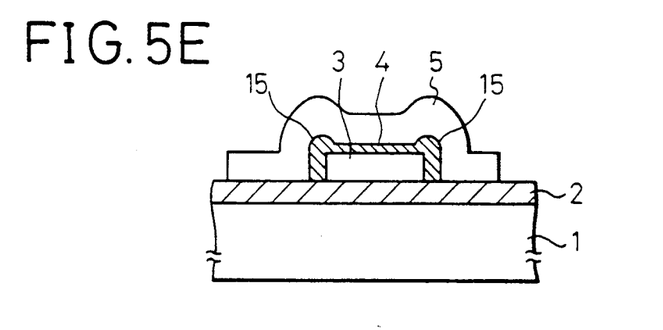

Then, as shown in FIGS. 4E and 5E a polycrystalline silicon layer having a thickness of about 4000 Å is formed on the SiO₂ insulating layer 2 and on the silicon layer 3, and impurities implanted therein so that the silicon layer is provided with a conductivity. After that, a patterning process by a usual photolithography technique is carried out so that a polycrystalline silicon gate electrode 5 is formed extending from the n⁻-type single-crystalline silicon layer 3 with the gate oxide layer 4 to the SiO₂ insulating layer 2 through the edge portions 14a and 14b.

Figure 4F:
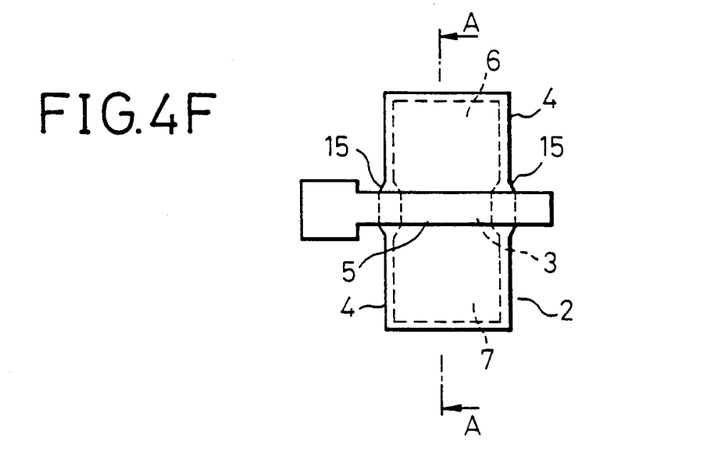
Figure 5F:
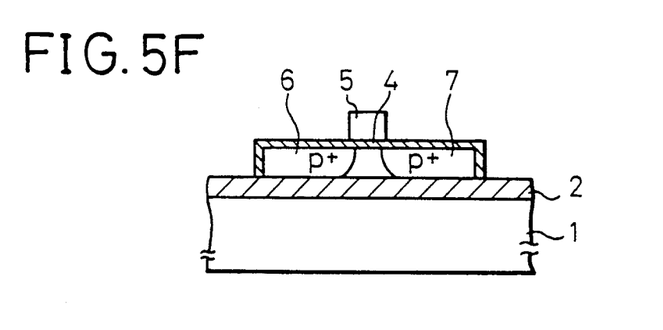

Then, as shown in FIGS. 4F and 5F using the gate electrode 5 as a mask, boron ions are selectively implanted into the n⁻-type single-crystalline silicon layer 3 and a predetermined annealing process is carried out to form a p⁺-type source region 6 and p⁺-type drain region 7.

An insulating layer is then formed, electrode window opened and wiring carried out, to produce a semiconductor (not shown).

As explained above, in the SOI structure MOS transistor according to the present invention, a thermal oxidation layer on edge portions 14a and 14b of the silicon layer 3, and a gate electrode 3 crossing the edges 14a and 14b, are selectively formed with a thickness larger than the gate oxide layer. Thus, even though defects of the thermal oxidation layer are formed, substantially no defective region remaining therein can be fully realized, with the result that the gate breakdown voltage i.e., the insulation breakdown voltage between the gate electrode and the silicon substrate is fully maintained.

I claim:

1. A semiconductor device comprising:
   an insulating substrate;
   an island-shaped single-crystalline semiconductor layer provided on the insulating substrate;
   an insulating layer provided on an exposed surface of the single-crystalline semiconductor layer; and
   a conductor pattern provided on the single-crystalline semiconductor layer, with the insulating layer therebetween, and said conductor pattern extending to said insulating substrate, said insulating layer which is provided at an edge and a side region of the single-crystalline semiconductor layer below the conductor pattern, being selectively formed with a larger thickness than at a top and remaining side portions of the single-crystalline semiconductor layer.

2. A semiconductor device according to claim 1, wherein said insulating substrate is an $SiO_2$ layer.

3. A semiconductor device according to claim 1, wherein said single-crystalline semiconductor layer is a single-crystalline silicon layer.

4. A semiconductor device according to claim 1, wherein said conductor pattern is a gate electrode.

5. A semiconductor device according to claim 1, wherein said insulating layer is a thermally grown oxide layer.

* * * * *